US008028254B2

(12) United States Patent
Inoue et al.

(10) Patent No.: US 8,028,254 B2
(45) Date of Patent: Sep. 27, 2011

(54) DETERMINING MANUFACTURABILITY OF LITHOGRAPHIC MASK USING CONTINUOUS DERIVATIVES CHARACTERIZING THE MANUFACTURABILITY ON A CONTINUOUS SCALE

(75) Inventors: Tadanobu Inoue, Kanagawa-ken (JP); David O. Melville, New York, NY (US); Hidemasa Muta, Tokyo-to (JP); Kehan Tian, Poughkeepsie, NY (US); Masaharu Sakamoto, Kanagawa-ken (JP); Alan E. Rosenbluth, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 355 days.

(21) Appl. No.: 12/334,488

(22) Filed: Dec. 14, 2008

(65) Prior Publication Data
US 2010/0153903 A1  Jun. 17, 2010

(51) Int. Cl.
*G06F 17/50* (2006.01)
(52) U.S. Cl. ............... 716/56; 716/50; 716/51; 716/52; 716/53; 716/54; 716/55
(58) Field of Classification Search .............. 716/50–56
See application file for complete search history.

(56) References Cited

U.S. PATENT DOCUMENTS

| 6,563,566 | B2 | 5/2003 | Rosenbluth et al. | |
| 7,057,709 | B2 | 6/2006 | Rosenbluth | |
| 2003/0208742 | A1* | 11/2003 | LaCour | 716/21 |
| 2006/0085773 | A1* | 4/2006 | Zhang | 716/4 |
| 2007/0162887 | A1* | 7/2007 | Suh et al. | 716/21 |
| 2007/0266346 | A1* | 11/2007 | Wu | 716/2 |
| 2008/0059918 | A1* | 3/2008 | Bergeron et al. | 716/2 |
| 2010/0146465 | A1* | 6/2010 | Berkens et al. | 716/2 |

OTHER PUBLICATIONS

A.E. Rosenbluth et al., "Optimum mask and source patterns to print a given shape," Society of photo-optical instrumentation engineers, JM3, Apr. 2002.
A.E. Rosenbluth et al., "Method for forming arbitrary lithographic wavefronts using standard mask technology," IBM disclosure YOR8-2005-0697, Oct. 4, 2007.
A.E. Rosenbluth et al., "Gobal optimization of masks, including film stack design to restore TM contrast to high NA TCC's," Proceedings—SPIE the International Society for Optical Engineering, year 2007.
A.E. Rosenbluth et al., "A method for global optimization of lithographic source intensities under contingent requirements," IBM disclosure YOR8-2007-0556, May 14, 2007.
A.E. Rosenbluth et al., "Global optimization of the illumination distribution to maximize integrated process window," Procs. of SPIE, year 2006.

* cited by examiner

*Primary Examiner* — Paul Dinh
*Assistant Examiner* — Bryce Aisaka
(74) *Attorney, Agent, or Firm* — Vazken Alexanian

(57) ABSTRACT

The manufacturability of a lithographic mask employed in fabricating instances of a semiconductor device is determined. Target edge pairs are selected from mask layout data of the lithographic mask, for determining a manufacturing penalty in making the lithographic mask. The mask layout data includes polygons, where each polygon has a number of edges. Each target edge pair is defined by two of the edges of one or more of the polygons. The manufacturability of the lithographic mask, including the manufacturing penalty in making the lithographic mask, is determined. Determining the manufacturing penalty is based on the target edge pairs as selected. Determining the manufacturability of the lithographic mask uses continuous derivatives characterizing the manufacturability of the lithographic mask on a continuous scale. The manufacturability of the lithographic mask is output. The manufacturability of the lithographic mask is dependent on the manufacturing penalty in making the lithographic mask.

18 Claims, 10 Drawing Sheets

US 8,028,254 B2

DETERMINING MANUFACTURABILITY OF LITHOGRAPHIC MASK USING CONTINUOUS DERIVATIVES CHARACTERIZING THE MANUFACTURABILITY ON A CONTINUOUS SCALE

RELATED PATENT APPLICATIONS

The present patent application is related to the following patent applications, which are hereby incorporated by reference:

(1) The patent application entitled "determining manufacturability of lithographic mask by reducing target edge pairs used in determining a manufacturing penalty of the lithographic mask," filed on Dec. 14, 2008, and assigned Ser. No. 12/334,482; and, (2) The patent application entitled "determining manufacturability of lithographic mask by selecting target edge pairs used in determining a manufacturing penalty of the lithographic mask," filed on Dec. 14, 2008, and assigned Ser. No. 12/334,485.

FIELD OF THE INVENTION

The present invention relates generally to determining the manufacturability of a lithographic mask employed in fabricating instances of a semiconductor device, and more particularly to determining such manufacturability by using continuous derivatives characterizing the manufacturability on a continuous scale.

BACKGROUND OF THE INVENTION

Semiconductor devices include semiconductor processors, semiconductor memories, such as static random-access memories (SRAM's), and other types of semiconductor devices. A common semiconductor device fabrication process is photolithography. In photolithography, a semiconductor surface is selectively exposed to light through a lithographic mask. The semiconductor surface is developed, and the areas that were exposed to light (or the areas that were not exposed to light) are removed.

Therefore, to employ photolithography in fabricating instances of a given semiconductor device, a lithographic mask first has to be manufactured. However, depending on various aspects of the semiconductor device, such as its complexity, the lithographic mask can be relatively difficult (if not impossible) to manufacture, or relatively easy to manufacture. As such, it can be important to assess the manufacturability of a lithographic mask before the mask is actually made.

SUMMARY OF THE INVENTION

The present invention relates to determining the manufacturability of a lithographic mask, by using continuous derivatives characterizing the manufacturability on a continuous scale. A method of an embodiment of the invention determines the manufacturability of a lithographic mask that is employed in fabricating instances of a semiconductor device. The method may be implemented as one or more computer programs stored on a computer-readable medium, such as a tangible computer-readable medium like a recordable data storage medium. When executed, the computer programs perform the method.

The method selects a number of target edge pairs from mask layout data of the lithographic mask, which are used to determine the manufacturing penalty in making the mask. The mask layout data includes a number of polygons. Each polygon has a number of edges, and each target edge pair is defined by two of the edges of one or more of the polygons. The method determines the manufacturability of the lithographic mask, including determining the manufacturing penalty in making the mask. The manufacturing penalty is determined based on the target edge pairs as have been selected. The manufacturability is determining by using continuous derivatives characterizing the manufacturability of the lithographic mask on a continuous scale. For instance, smoothly varying assessment functions representing the manufacturing penalty may be used. The method finally outputs the manufacturability of the lithographic mask. This manufacturability is dependent on the manufacturing penalty in making the mask.

In one embodiment, the manufacturability of the lithographic mask is determined by performing one or more of the following (including performing all of the following in one embodiment). First, for a first selected target edge pair having a first edge and a second edge that belong to a same polygon and that are at least substantially parallel to one another, a manufacturing shape penalty resulting from the first selected target edge pair can be determined. The manufacturing shape penalty relates to a penalty incurred in manufacturing the lithographic mask due to a shape of the same polygon. Determining the manufacturing shape penalty can include evaluating $$P_{shape} = P_{gap\_size} \times P_{jog\_stair} \times P_{aspect\_ratio\_i\_a} \times P_{aspect\_ratio\_j\_a} \times P_{overlap}.$$

$P_{shape}$ denotes the manufacturing shape penalty, $P_{gap\_size}$ denotes a manufacturing penalty owing to a size of a gap between the first and the second edges, and $P_{jog\_stair}$ denotes a manufacturing penalty owing to whether the first and the second edges define a jog shape or a stair shape. Furthermore, $P_{aspect\_ratio\_i\_a}$ denotes a manufacturing penalty owing to an aspect ratio of the first edge denoted as i relative to a size of a gap between the two edges i and j, $P_{aspect\_ratio\_j\_a}$ denotes a manufacturing penalty owing to an aspect ratio of the second edge denoted as j relative to the size of a gap between the two edges i and j, and $P_{overlap}$ denotes a manufacturing penalty owing to a degree of overlap between the first and the second edges. $P_{shape}$, $P_{gap\_size}$, $P_{jog\_stair}$, $P_{aspect\_ratio\_i\_a}$, $P_{aspect\_ratio\_j\_a}$, and $P_{overlap}$ are smoothly varying continuous functions, as opposed to non-smoothly varying discontinuous functions.

Second, for a second selected target edge pair having a third edge belong to a third polygon and a fourth edge belonging to a fourth polygon that is different than the third polygon, where the third and the fourth edges are at least substantially parallel to one another, a manufacturing gap penalty resulting from the second selected target edge pair can be determined. The manufacturing gap penalty relates to a penalty incurred in manufacturing the lithographic mask due to a gap between the third and the fourth polygons. Determining the manufacturing gap penalty can include evaluating $$P_{gap} = P_{gap\_size} \times P_{overlap}.$$

$P_{gap}$ denotes the manufacturing gap penalty, $P_{gap\_size}$ denotes a manufacturing penalty owing to a size of a gap between the third and the fourth edges, and $P_{overlap}$ denotes a manufacturing penalty owing to a degree of overlap between the third and the fourth edges. $P_{gap}$, $P_{gap\_size}$, and $P_{overlap}$ are smoothly varying continuous functions, as opposed to non-smoothly varying discontinuous functions.

Third, for a third selected target edge pair having a fifth edge and a sixth edge, where the fifth and the sixth edges are at least substantially perpendicular to one another, a manufacturing crossing penalty resulting from the third selected target edge pair can be determined. The manufacturing crossing penalty related to a penalty incurred in manufacturing the lithographic mask due to potential overlap between two polygons and a bow tie shape by one polygon. Determining the manufacturing crossing penalty can include evaluating $$P_{crossing} = w_{crossing} \times P_{crossing\_i\_j} \times P_{crossing\_j\_i}.$$

$P_{crossing}$ denotes the manufacturing crossing penalty, $w_{crossing}$ denotes a constant, $P_{crossing\_i\_j}$ denotes a manufacturing penalty owing to the fifth edge denoted as i crossing the sixth edge denoted as j, and $P_{crossing\_j\_i}$ denotes a manufacturing penalty owing to the sixth edge denoted as j crossing the fifth edge denoted as i. $P_{crossing}$, $P_{crossing\_i\_j}$, and $P_{crossing\_j\_i}$ are smoothly varying continuous functions, as opposed to non-smoothly varying discontinuous functions.

Still other aspects and embodiments of the invention will become apparent by reading the detailed description that follows, and by referring to the following drawings.

BRIEF DESCRIPTION OF THE DRAWINGS

The drawings referenced herein form a part of the specification. Features shown in the drawing are meant as illustrative of only some embodiments of the invention, and not of all embodiments of the invention, unless otherwise explicitly indicated, and implications to the contrary are otherwise not to be made.

DETAILED DESCRIPTION OF THE DRAWINGS

Figure 1A:
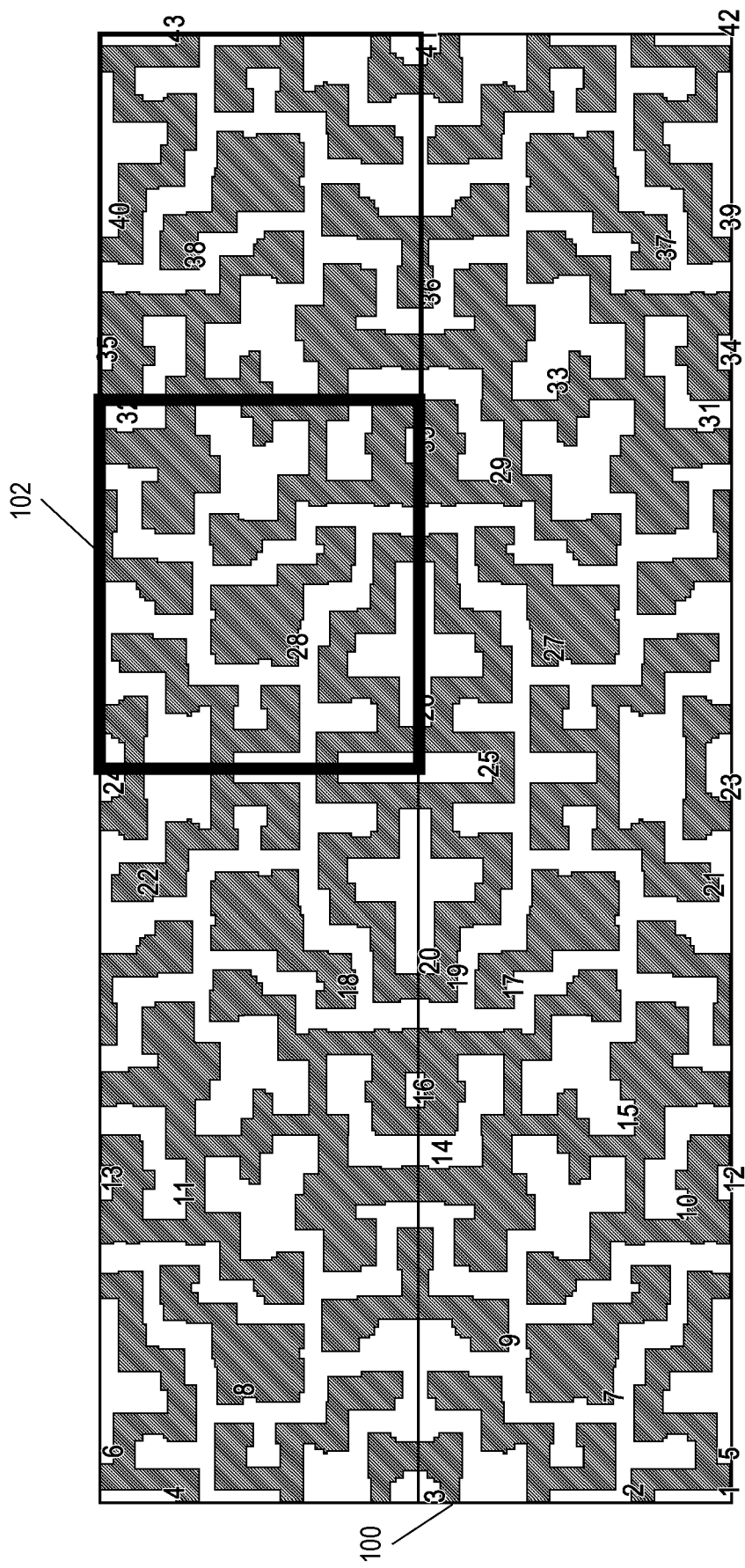
FIG. 1A is a diagram of a representative lithographic mask layout, according to an embodiment of the invention.

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

Problem Background and Solution Overview

There is increasing interest in lithographic optimization methods that attempt to optimally manage the fundamental resolution constraints imposed by state-of-the-art exposure tools. One such approach is known as source mask optimization (SMO). In SMO, the set of diffraction orders obtained from a mask, which is referred to as a wavefront, is directly optimized, permitting this approach to efficiently gauge the true degrees of freedom of the process, and thus to determine an optimal set of image-forming waves that can be propagated through a finite optical system to print a desired pattern.

To achieve this, SMO typically defers consideration of purely indirect constraints that are imposed by mask-shape topology and that are not fundamental to the imaging process. More specifically, SMO addresses mask shape constraints typically during a concluding wavefront engineering step that is carried out after the optimum wavefront has been determined. This divide-and-conquer approach prevents the unnecessary penalization of imaging performance that can result from ad-hoc mixing of manufacturability and process window terms in a single relatively cumbersome objective.

The wavefront engineering process of SMO has two stages. The first stage generates an initial approximation to a manufacturable mask by synthesizing a bitmap mask. In the second stage, the bitmap is converted to polygons, and the corner positions of these corner positions are optimized. One requirement during the second stage optimization is that the mask polygons be made manufacturable. While manufacturability is also important to the first stage—which is referred to as gridline optimization—existing technologies for assessing mask manufacturability are ill-suited to the solution of mask optimization problems.

Until recently, lithographic practice retained a partial correspondence between mask shapes and target designs. For instance, the well known model-based optical proximity correction (MBOPC) approach exploits this correspondence to correct printed edge positioning by using separate sequential applications of a derivative-free shooting or feedback method, in which each printed edge is treated as being coupled to a corresponding and controlling mask edge. This model-driven approach itself has replaced earlier rule-based OPC methods for determining edge correction.

However, in state-of-the-art applications, the corrector framework of MBOPC can become problematic for a number of reasons. The underlying cause of these reasons is the necessity of pushing very aggressively against the resolution limits of exposure tools where performance has reached technologic limits, by such techniques as superimposing multiple exposures of masks that have pattern densities very near the resolution limit. Such aggressive measures pose certain difficulties. For example, increasing edge density by summing across multiple exposures can make it less meaningful to posit specific connections between individual edges in the masks and individual edges in the target pattern. Such identification can even become more undesirable, since improved performance can be obtained using mask patterns that have greater complexity than the original design.

In addition, the complex optimization approaches that are being increasingly resorted to in the absence of direct resolution improvements can give rise to topologically complex mask shapes having edge fragments that often have very little geometrical correlation with individual edge segments of features of the original design. This is a consequence of the success with which advanced mask design approaches make possible the printing of image features that are considerably smaller than the classical resolution limit of the exposure tool. When such methods are pursued aggressively, it usually becomes desirable to fit a relatively large number of mask feature elements within each resolution patch of the lens, and these features are sometimes phase-shifted. As a result, there may no longer be a simple one-to-one correspondence between the mask features and the original design features.

Conversely, the mask manufacturability rules that have conventionally been used have their origin in rules for laying out circuit designs. As such, these rules are relatively simple, involving features and separations of main features, or involve decorations to these features, such as serifs or hammerheads. This simple division also existing mask manufacturability rules to distinguish requirements for rendering features that predominantly correspond to primary circuit features from those which take the form of unresolved OPC decorations on the primary features. Such OPC decorations, which may also be serifs or hammerheads, are referred to as assist features, and rules relating to them may be considered a third category of rules. Such assist features are unresolved lines which are separate from the primary features, but are not typically adjusted during conventional OPC techniques.

Unfortunately, advanced lithographic optimization approaches can give rise to masks having features that follow no such simple divisions, and in fact the features need not fall into any clear-cut discrete categories. Elements that resemble decorations can themselves have decorations, and in general the features in these newer types of heavily optimized advanced masks exhibit a more uniform continuity in their structures across different scales that has been traditionally seen.

Moreover, conventional mask manufacturability rules only serve to classify a set of patterns as manufacturable or non-manufacturable, and do so based on specific topological categories into which the pattern features fall. However, small motions can sometimes change the character of a feature, and as a result difficulties arise in advanced applications when one attempts to employ existing rule-based techniques that apply classification rules to ascertain manufacturability. In particular, it can be difficult to apply conventional rule-based techniques to the advanced task of obtaining a quantitative metric as to the severity of non-manufacturability in patterns that conventional approaches simply classify as being non-manufacturable. Such a metric is nevertheless desirable for optimization, since powerful techniques are available to improve features of interest that can be expressed as smooth continuous functions, including the case where the improvements must respect constraint requirements that can likewise be expressed in terms of smooth and continuous functions.

In addition, conventional classification of patterns as manufacturable (or not) is ultimately an oversimplification. Typically what is meant is that when working with patterns that are derived using standard OPC techniques, the mask maker has found that if the patterns obey a set of empirically deduced manufacturability rules, the patterns can very likely be fabricated within a quoted set of tolerances. Although useful as a practical matter, such a formulation ignores the possibility that the body of experience that is used to determine the set points for the manufacturability rules will likely fail to provide proper guidance when the set points are applied to patterns that are atypical in some way.

Furthermore, even if correct, conventional prior art mask manufacturability rules may not provide the user with an adequate picture of the tradeoffs involved in fabricating a set of patterns. A simple certification that the feature dimensions will allow specified tolerances to be met is limited in this respect. In some cases, there can be potential benefits to the user from achieving significantly tightened tolerances by using features that do not push close to the manufacturability limits, assuming that such features can still provide adequate performance within the lithographic image that produce. The conventional rules thus provide no quantitative guidance as to whether a contemplated change in a manufacturable shape improves manufacturability or degrades it.

Another consideration in advanced mask designs is that feature decorations and even some features themselves, such as assist features that are desirably subject to optimization along with other features, are not resolvable by the projection lens, but are included on the mask only for their corrective effect on the imaging behavior of neighboring features. It is noted that the patterns in lithographic masks are commonly polygonal, and often can be assumed to consist of only horizontal and vertical edges, which is referred to as being "Manhattan."

However, with state-of-the-art features that are heavily directed for OPC, it can be impossible and unnecessary to faithfully reproduce shallow fragments and sharp corners of such polygons as literal shapes. Nonetheless, such shapes must usually be successfully registered into the mask film with high yield as rounded apertures. Although fragmented edge decorations, which can also be referred to as "jogs," in such features cannot be reproduced with high fidelity, they should still register as appropriate deviations within the mask aperture's contour at the positions of the jogs.

Embodiments of the invention solve these foregoing issues and problems. In particular, embodiments of the invention provide a smoothly differentiable metric that expresses the manufacturability of mask features in terms of the above-identified requirements for lithographic masks. Such a metric can be used in any mask optimization or refinement procedure in which manufacturability tradeoffs are usefully assess using a quantitative metric. An example of such a procedure is SMO, as has been described above.

In general, embodiments of the invention generate a manufacturability metric for a set of Manhattan patterns by applying smooth assessment functions to the pattern coordinates, and specifically to the coordinates of pairs of edges in the patterns. If the polygon edges are traversed in a specific handedness, such as the well-known right-handed rule, each edge has a start coordinate and an end coordinate, allowing the edges to be treated as signed vector quantities. This in turn permits the distinction between close edges that form what is referred to herein as a "stair," as is described in detail later in the detailed description, and close edges that form a narrow gap, where the former are easier to manufacture than the latter.

Furthermore, the difficulty in manufacturing a narrow gap can be eased if the polygon portion in question is actually elongated in such a way as to be narrower in the perpendicular direction to form what is referred to herein as a "tab-like jog," which is also described in detail later in the detailed description. As noted above, the mask writer need not reproduced such a jog with high fidelity, but nevertheless has to register an appropriate deviation in the feature contour at the jog's position. The manufacturability metric provided by embodiments of the invention encapsulates these considerations using smoothly varying assessment functions, as is described in detail later in the detailed description.

Embodiments of the invention provide for different assessment functions for different types of manufacturability constraints, such as shape, gap, and crossing constraints, and that permit smooth convergence. A particular structure of these functions, such as piece-wise quadratic, can be selected in a way that renders the functions not only continuous, but also differentiable. This is advantageous, because optimization algorithms can be arbitrarily sensitive to slope discontinuities. In some embodiments, jog and stair assessment functions can be combined in a uniform manner, which provides for a smooth transition between these two otherwise topologically distinct configurations.

Technical Background and Overview

Figure 1B:
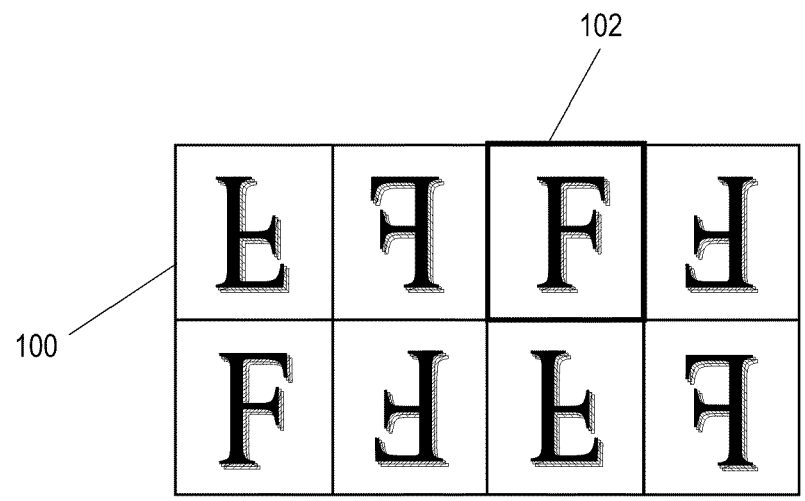
FIG. 1B is a diagram depicting the symmetry of the layout of FIG. 1A, according to an embodiment of the invention.
Figure 1C:
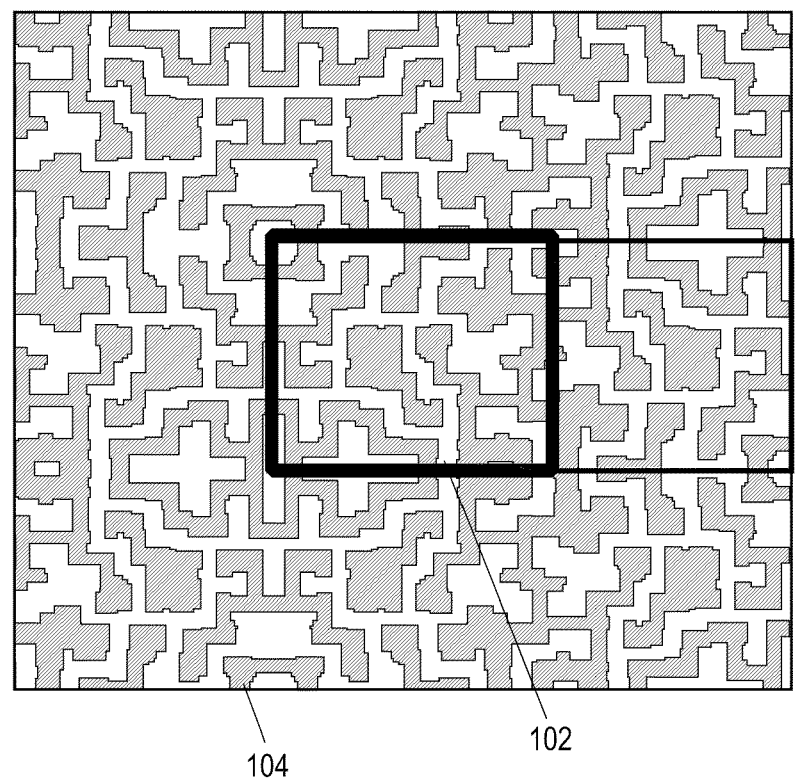
FIG. 1C is a diagram depicting the replication of a cell of the layout of FIG. 1A, according to an embodiment of the invention.

FIG. 1A shows a representative lithographic mask layout 100, according to an embodiment of the invention. The lithographic mask layout 100 includes a cell 102 that is symmetrically duplicated throughout the layout 100. In particular, FIG. 1B shows the symmetry of the cell 102 within the lithographic mask layout 100, according to an embodiment of the invention. The letter F is used in FIG. 1B to denote the cell 102 in the layout 100 of FIG. 1A, and the various iterations of the letter F in FIG. 1B show how the cell 102 is symmetrically duplicated throughout the layout 100 in FIG. 1A. The symmetry in FIG. 1B can be referred to as a staggered symmetry. To assess the manufacturability of the lithographic mask layout 100, particularly at the boundaries of the cell 102, the mask layout data underlying the layout 100 is replicated over n-by-n units, where n may be equal to three. For instance, FIG. 1C shows such a replication 104 based on the cell 102, according to an embodiment of the invention.

Figure 2:
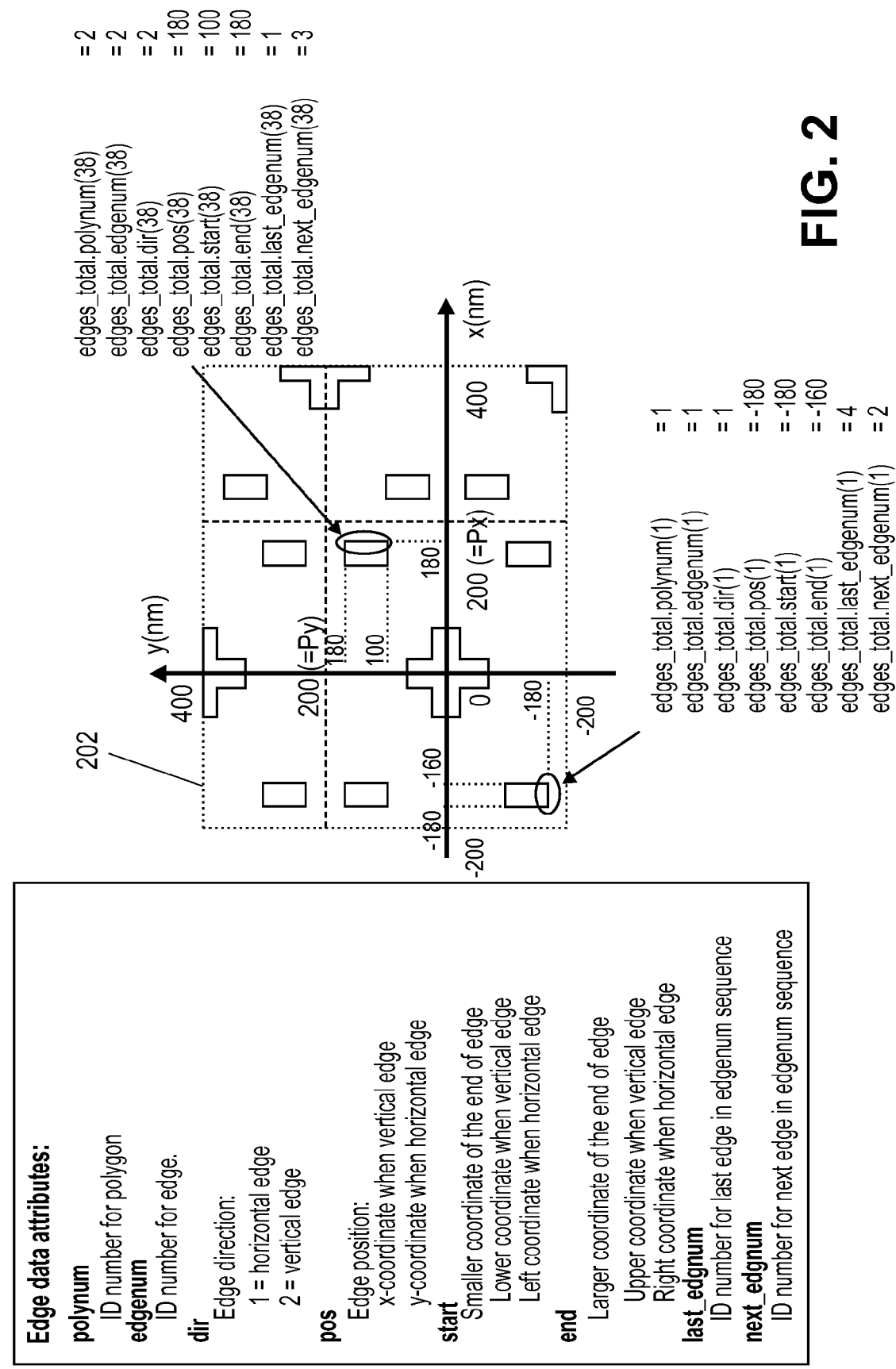
FIG. 2 is a diagram depicting representative mask layout data for a portion of a lithographic mask layout, according to an embodiment of the invention.

FIG. 2 shows representative mask layout data for a portion 202 of the lithographic mask layout 100, according to an embodiment of the invention. It is noted that the lithographic mask layout 100 includes a number of polygons. Each polygon has a number of edges. An edge pair is defined as a pair of different edges, of the same or different polygons. For example, an edge pair may include two different edges of the same polygon, or an edge pair may include two edges of different polygons.

Furthermore, each edge of each polygon can have a number of attributes: polynum, edgenum, dir, pos, start, end, last_edgenum, and next_edgenum. Polynum is the identification for of the polygon to which the edge in question belongs. Edgenum is the identification of the edge in question within this polygon. Dir is the edge direction, where a first value, like one, may specify the horizontal direction, and a second value, like two, may specify the vertical direction. Pos is the edge position, including the x-coordinate for a vertical edge and a y-coordinate for a horizontal hedge. Start is the smaller coordinate of the end of the edge, which is the lower coordinate for a vertical edge, and the left coordinate for a horizontal edge. End is the larger coordinate of the end of the edge, which is the upper coordinate for a vertical edge, and the right coordinate for a horizontal edge. Last_edgenum is the identification number of the previously connected edge within the same polygon, in a prespecified direction (i.e., clockwise or counter-clockwise). Similarly, next_edgenum is the identification number of the next connected edge within the same polygon, in the prespecified direction.

Figure 3A:
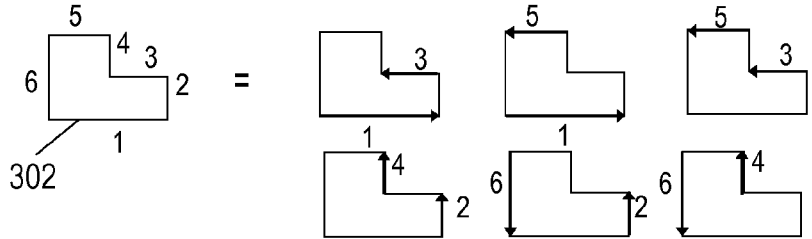
FIGS. 3A, 3B, and 3C are diagrams representing three different types of manufacturing penalties that can occur when determining the manufacturability of a lithographic mask, according to an embodiment of the invention.
Figure 3B:
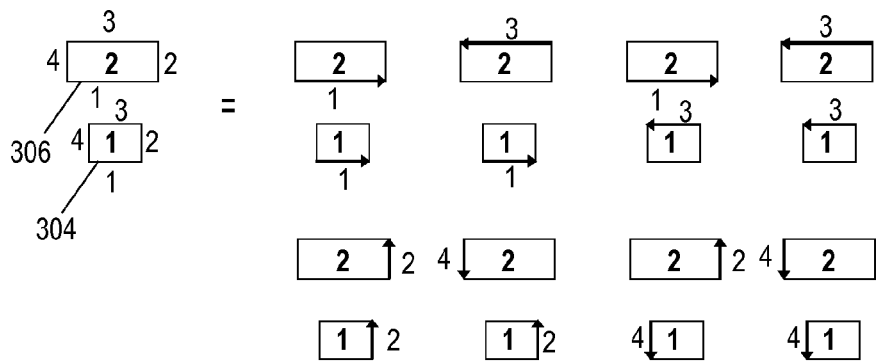
Figure 3C:
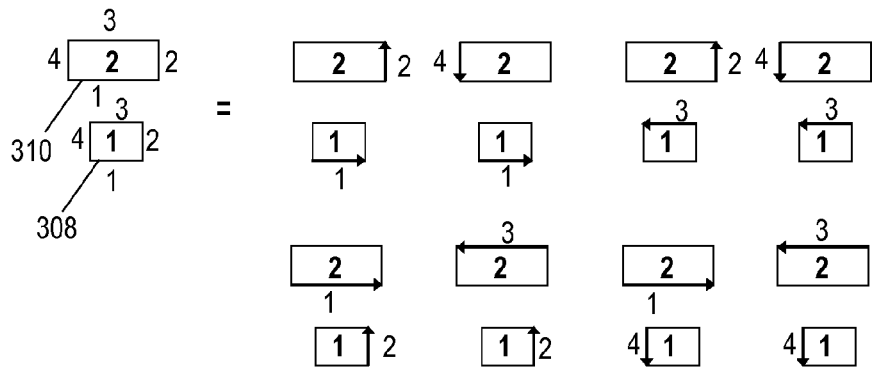

FIGS. 3A, 3B, and 3C represent three different types of manufacturing penalties that can occur when determining the manufacturability of a lithographic mask, according to varying embodiments of the invention. FIG. 3A particularly shows a penalty for the shape of a single polygon, which is referred to as a shape penalty. FIG. 3B particularly shows a penalty for the gap between two different polygons, which is referred to as a gap penalty. FIG. 3C particularly shows a penalty for crossing edges between two different polygons, which is referred to as a crossing penalty.

In FIG. 3A, the polygon 302 has six edges. Each different pair of parallel edges within this polygon 302 makes up a target edge pair that represents a corresponding shape penalty for the polygon 302, as depicted on the right-hand side of FIG. 3A. In FIG. 3B, the polygons 304 and 306 each has four edges. Each different pair of parallel edges of the polygons 304 and 306 (i.e., with one edge from the polygon 304 and one edge from the polygon 306) makes up a target edge pair that represents a corresponding gap penalty for the two polygons 304 and 306, as depicted on the right-hand side of FIG. 3B. In FIG. 3C, the polygons 308 and 310 each has four edges. Each different pair of non-parallel, or crossing, edges of the polygons 308 and 310 (i.e., with one edge from the polygon 308 and one edge from the polygon 310) makes up a target edge pair that represents a corresponding crossing penalty for the two polygons 308 and 310.

A shape penalty is a manufacturing penalty incurred in manufacturing the lithographic mask due to the shape of a single polygon, owing to the difficulty in making the shape. Thus, a target edge pair can define the two edges of a given polygon that represent a shape penalty. A gap penalty is a manufacturing penalty incurred in manufacturing the lithographic mask due to the gap between the two edges of two different polygons, owing to the difficulty in maintaining this gap. Thus, a target edge pair can define the two edges of two different polygons that represent a gap penalty. A crossing penalty is a manufacturing penalty incurred in manufacturing the lithographic mask due to the potential for overlap between the two edges of two different polygons and a bow tie shape by one polygon, owing to the difficulty in insuring that such overlap does not occur. Thus, a target edge pair can define the two edges of two different polygons that represent a crossing penalty.

Figure 4:
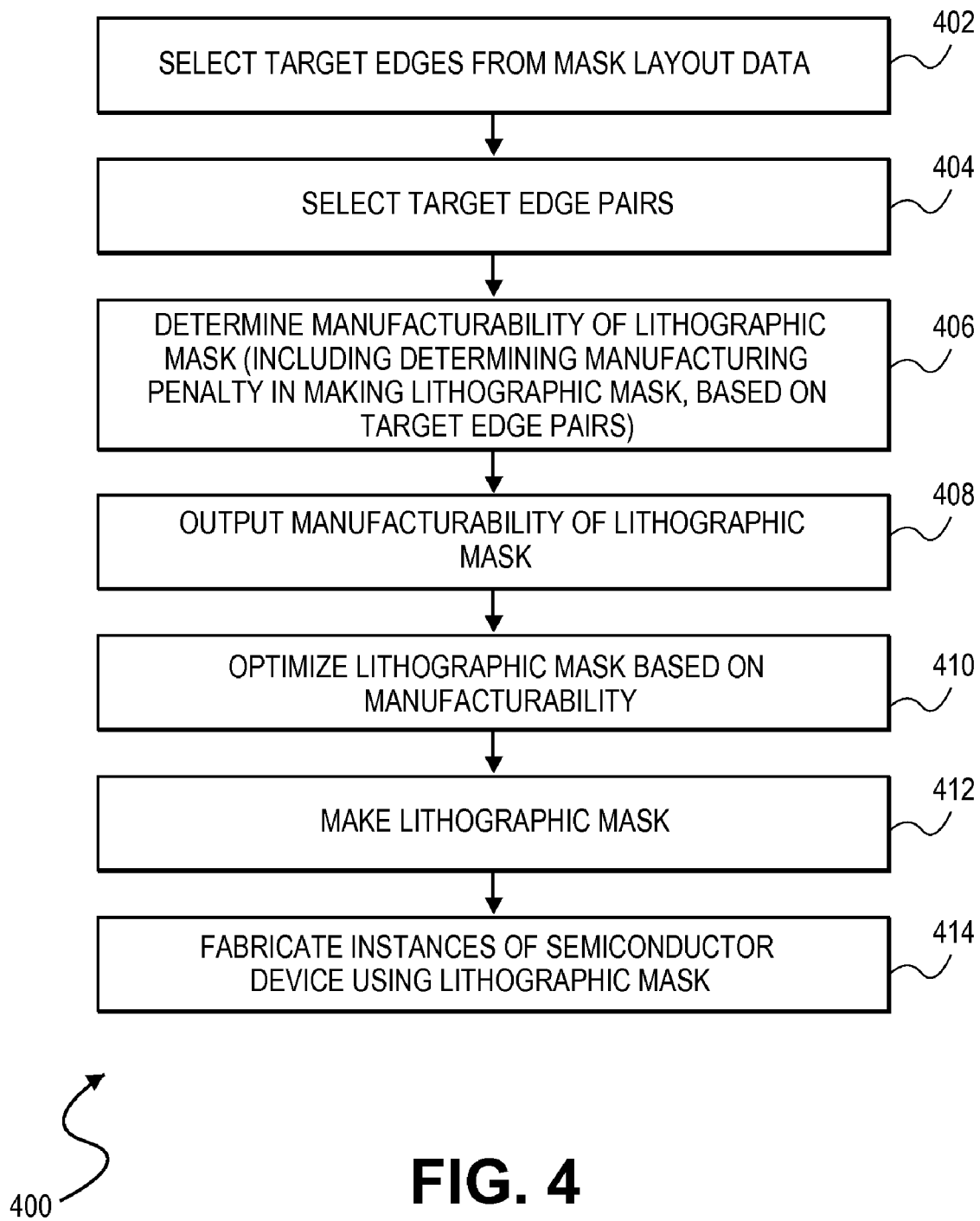
FIG. 4 is a flowchart of a method, according to an embodiment of the invention.

FIG. 4 shows a method 400 for determining the manufacturability of a lithographic mask used to fabricate instances of a semiconductor device, according to an embodiment of the invention. Target edges are selected from mask layout data representing a lithographic mask (402). Thereafter, target edge pairs are selected (404). The target edge pairs are selected in one embodiment to represent each potential instance of a manufacturing penalty, such as a shape penalty, a gap penalty, or a crossing penalty. That is, in at least some embodiments, target edge pairs are identified in part 402 that represent all potential instances of manufacturing penalties like shape, gap, and crossing penalties.

Furthermore, in one embodiment, target edges are selected from mask layout data in part 402, and target edge pairs are selected in part 404 as described in a subsequent section of the detailed description. However, various other approaches to how to select target edges and target edge pairs can be employed as well. For instance, a greedy approach may be followed in which all target edges of all polygons are selected, and all unique target edge pairs of these target edges are selected, although this approach may be computationally intractable. Furthermore, the target edges and/or the target edge pairs may be selected and/or reduced in number as described in the patent applications referenced above and that have been incorporated by reference.

Thereafter, the manufacturability of the lithographic mask is determined (406), which includes determining the manufacturing penalty in making the lithographic mask, based on the target edge pairs. The manufacturing penalty in making the lithographic mask can include the shape, gap, and crossing penalties that have been described. In one embodiment of the invention, the manufacturability of the lithographic mask and the manufacturing penalty in making the lithographic mask are determined as representatively described in detail in subsequent sections of the detailed description in relation to particular types of manufacturing penalties. In particular, in relation to the manufacturing penalties that are determined for specified mask layout data, an overall manufacturability may be determined by summing these penalties and/or by averaging them, in various embodiments of the invention.

Once the manufacturability of the lithographic mask has been determined, it is output (408). For instance, the manufacturability may be displayed on a display device of a computer for viewing by a user. The method 400 of FIG. 4, including at least parts 402, 404, 406, and 408, may be performed by one or more computer programs, which may be executed by one or more processors of one or more computer devices, as can be appreciated by those of ordinary skill within the art.

Ultimately, the lithographic mask may have its design optimized, based on the manufacturability determine, so that it is in fact easier to manufacture (410). In this respect, parts 402, 404, 406, 408, and 410 of the method 400 may be iteratively performed until a lithographic mask having a desired manufacturability difficulty has been achieved. In one approach, variables and constraints for the optimization problem are first set up, and then a nonlinear optimization problem. More information regarding such an optimization problem solution is described later in the detailed description, along with an example of one particular type of optimization that can be implemented.

Finally, once a design for the lithographic mask has been approved, the lithographic mask may be made (412), and instances of a semiconductor device fabricated using the lithographic mask (414).

Selecting Target Edges and Target Edge Pairs

Figure 5:
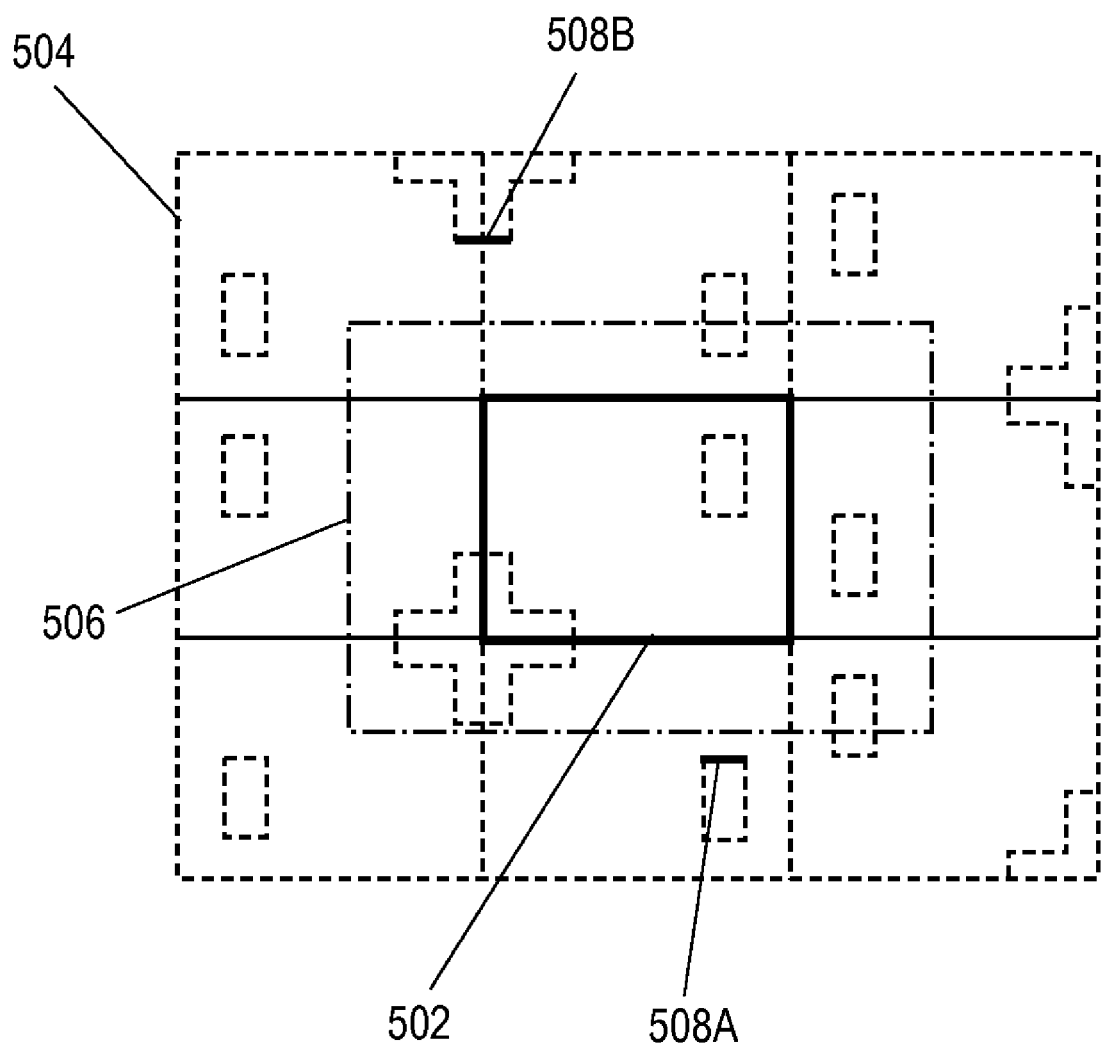
FIG. 5 is a diagram illustratively depicting an approach to selecting target edges and target edge pairs, according to an embodiment of the invention.

FIG. 5 illustratively depicts an approach to selecting target edges and target edge pairs, according to an embodiment of the invention. Mask layout data is divided into a number of cells. For a given cell being analyzed, such as the cell 502, the surrounding eight cells 504 are considered in addition to the cell 502. In particular, a predetermined boundary threshold around the cell 502 is considered, as indicated by the dotted line box 506 in FIG. 5.

Thus, in one embodiment, the target edges that are selected in part 402 of the method 400 of FIG. 4 for the cell 502 include all the edges that lie within the dotted line box 506. Thereafter, the target edge pairs that are selected in part 404 of the method 400 for the cell 502 include each unique pair of the target edges in one embodiment of the invention. In other embodiments, the target edge pairs may be selected in different ways, such as, for example, where at least one of the target edges within each target edge pair is within the cell 502 (such that the other edge of each target edge pair may be within the cell 502 or outside the cell 502 but within the dotted line box 506). As such, edges outside the dotted line box 506, such as the edges 508A and 508B, are not selected and are not part of any target edge pairs.

Determining Manufacturing Shape Penalty to Determine Manufacturability

Figure 6:
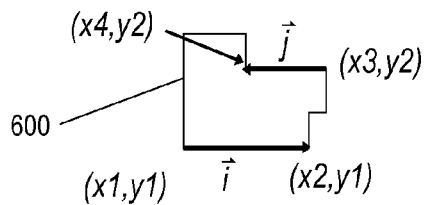
FIG. 6 is a diagram of a mask layout data polygon having edges that represent a jog, according to an embodiment of the invention.

FIGS. 6, 7A, 7B, and 7C show representative polygons 600, 700, 750, and 770, respectively, in relation to which how a manufacturing shape penalty to determine manufacturability is determined, according to varying embodiments of the invention. In FIG. 6, the polygon 600 has its edges ordered starting from edge i in a counter-clockwise manner around the polygon 600. Thus, the edge i points in the opposite direction as compared to the edge j.

Figure 7A:
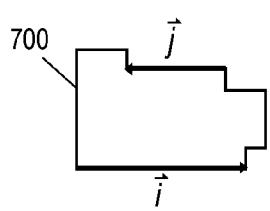
FIGS. 7A, 7B, and 7C are diagrams of mask layout data polygons having edges that represent a jog, a tab-like jog, and a stair, respectively, according to an embodiment of the invention.

In FIG. 7A, the polygon 700 also has its edges ordered starting from edge i in a counter-clockwise manner around the polygon 700. The edge i points in the opposite direction as compared to the edge j. Furthermore, it is noted that the polygon 700 has a jog shape. A jog shape can be described in relation to two parallel edges having opposite directions and separated by perpendicular edges.

Figure 7B:
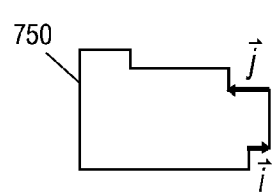

In FIG. 7B, the polygon 750 has its edges ordered in a counter-clockwise manner around the polygon 750. The edge i points in the opposite direction as compared to the edge j. Furthermore, it is noted that the polygon 750 has a tab-like jog shape. A tab-like jog shape can be described in relation to two parallel edges having opposite directions and separated by perpendicular edges. In addition, these two parallel edges are short enough that they do not need to be considered as a penalized shape.

Figure 7C:
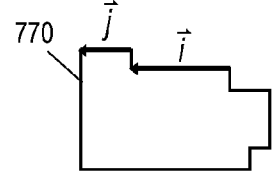

In FIG. 7C, the polygon 770 has its edges ordered in a counter-clockwise manner around the polygon 770. The edge i points in the same direction as compared to the edge j Furthermore, it is noted that the polygon 750 has a stair shape. A stair shape can be described in relation to two parallel edges having the same direction and separated by a perpendicular edge. It is noted, therefore, that one difference of the edges i and j in FIG. 7C as compared to in FIGS. 7A and 7B is that these edges have the same direction in FIG. 7C, while they have opposite directions in FIGS. 7A and 7B.

To determine the manufacturing shape penalty in part 406 of the method 400 of FIG. 4 for a selected target edge pair having a first edge and a second edge that belong to the same polygon and that are at least substantially parallel to one another, the following expression is evaluated:

$$P_{shape} = P_{gap\_size} \times P_{jog\_stair} \times P_{aspect\_ratio\_i\_a} \times P_{aspect\_ratio\_j\_j\_a} \times P_{overlap}$$

The shape penalty $P_{shape}$ is defined as a product of four assessment functions: a gap size factor function $P_{gap\_size}$; a jog stair detection function $P_{jog\_stair}$; two aspect ratio factor functions $P_{aspect\_ratio\_i\_a}$ and $P_{aspect\_ratio\_j\_a}$, and an overlap detection factor function $P_{overlap}$. $P_{shape}$, $P_{gap\_size}$, $P_{jog\_stair}$, $P_{aspect\_ratio\_i\_a}$, $P_{aspect\_ratio\_j\_a}$, and $P_{overlap}$ are smoothly varying continuous functions, as opposed to non-smoothly varying discontinuous functions. These functions are desirably differentiable, and may be defined as piece-wise quadratic functions or sigmoid functions in varying embodiments of the invention.

Figure 8A:
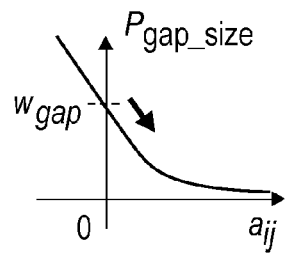
FIGS. 8A, 8B, 8C, 8D, 8E, and 8F are diagrams of smooth, continuous, and differentiable functions that can be used to determine manufacturing penalties such as a shape penalty and/or a gap penalty, according to varying embodiments of the invention.

FIG. 8A illustratively depicts the gap size factor function $P_{gap\_size}$, according to an embodiment of the invention. $P_{gap\_size}$ denotes a manufacturing penalty owing to a size of a gap between the first and the second edges in question. In FIG. 8A, $w_{gap}$ denotes a weight coefficient for this assessment factor, and $a_{ij}$ denotes the gap between the edges. Thus, rather being a non-smoothly varying discontinuous function where $P_{gap\_size}$ forces a yes or no answer depending on whether there is indeed a gap between the two parallel edges in question, $P_{gap\_size}$ in FIG. 8A is a smoothly varying continuous functions where it is able to take on a number of different values as a function of the gap between the parallel edges. The function $P_{gap\_size}$ thus varies depending on the gap $a_{ij}$ between the edges.

Figure 8D:
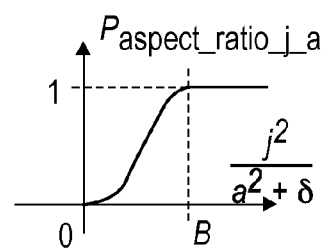
Figure 8B:
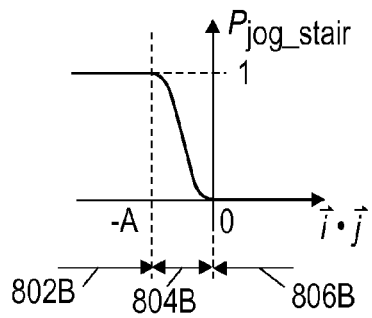

FIG. 8B illustratively depicts the jog stair detection function $P_{jog\_stair}$, according to an embodiment of the invention. $P_{jog\_stair}$ denotes a manufacturing penalty owing to whether the first and the second edges define a jog shape or a stair shape. In FIG. 8B, A denotes a threshold for judging a jog shape, and i·j denotes the dot product of the two edges (where these edges are vectors having both directions and magnitudes). The usual shape classification of whether two edges are forming a jog shape or a stair shape forces a discrete binary decision, yes or no. To avoid such a discontinuous outcome, the function of FIG. 8B provides a detection zone 804B of a tab-like jog shape between the jog shape zone 802B the and stair shapes zone 806B. An intermediate assessment value between 0 and 1 is provided to such a tab-like jog shape. The function $P_{jog\_stair}$ thus varies between 0 and 1 based on the value of the dot product of the two edges.

It is noted that while FIG. 7A shows a jog shape and FIG. 7C shows a stair shape, FIG. 7B shows a tab-like jog shape. It is further noted that as to the edges i and j in FIG. 7A, the inner product of the edge vectors i and j is negative. As a result, a $P_{jog\_stair}$ value is one. By comparison, as to the edges i and j in FIG. 7B, the inner product of the edge vectors i and j is small negative value, such that a $P_{jog\_stair}$ value is an intermediate value. By comparison, as to the edges i and j in FIG. 7C, the inner product of the edge vectors i and j is positive, such that a zero $P_{jog\_stair}$ value results.

An advantage of the approach used in embodiments of the invention is that it robustly encapsulates the manufacturability of complex pattern topologies by a regular and repetitive pair-wise assessment of edges. For example, two edges can be assessed as stair-like, even though they contain intermediate edges connecting them. As such, the possibility of narrow jogs in the pattern as a whole is taken care of when the intermediate edge pairs themselves are assessed.

Figure 8E:
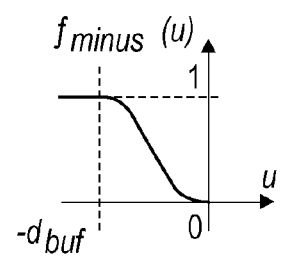
Figure 8C:
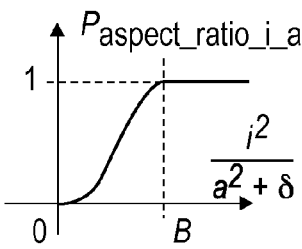

FIGS. 8C and 8D illustratively depict the aspect ratio functions $P_{aspect\_ratio\_i\_a}$ and $P_{aspect\_ratio\_j\_a}$, according to an embodiment of the invention. $P_{aspect\_ratio\_rato\_i\_a}$ denotes a manufacturing penalty owing to an aspect ratio of the first edge denoted as i relative to a size of a gap between the two edges i and j, whereas $P_{aspect\_ratio\_j\_a}$ denotes a manufacturing penalty owing to an aspect ratio of the second edge denoted as j relative to the size of a gap between the two edges i and j. In FIG. 8C, the function $P_{aspect\_ratio\_i\_a}$ varies between 0 and 1 depending on the value $$\frac{i^2}{a^2+\delta},$$

where $i^2$ is the magnitude, squared, of edge i, $a^2$ is a size of a gap between the two edges i and j, squared, and $\delta$ is a constant. The constant $\delta$ represents a small number to avoid division by zero. Similarly in FIG. 8D, the function $P_{aspect\_ratio\_j\_a}$ varies between 0 and 1 depending on the value $$\frac{j^2}{a^2+\delta},$$

where $j^2$ is the magnitude, squared, of edge j. In FIGS. 8C and 8D, the constant B represents a threshold for judging whether the shape in question should be considered a penalized shape. As with the other assessment functions, the aspect ratio functions are smoothly varying.

Figure 8F:
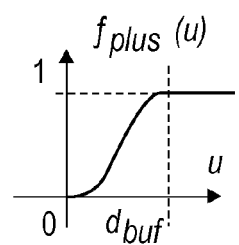

FIGS. 8E and 8F illustratively depict functions $f_{minus}(u)$ and $f_{plus}(u)$ that are used in evaluating the overlap detection factor function $P_{overlap}$, according to an embodiment of the invention. $P_{overlap}$ denotes a manufacturing penalty owing to a degree of overlap between the first and the second edges. $P_{overlap}$ is determined in one embodiment as:

$$P_{overlap}=(1-v_1)\cdot(1-v_2),$$

where:

$$v_1 f_{minus}(x_1-x_3)\cdot f_{minus}(x_1-x_4)\cdot f_{minus}(x_2-x_3)\cdot f_{minus}(x_2-x_4) \text{ and}$$

$$v_2=f_{plus}(x_1-x_3)\cdot f_{plus}(x_1-x_4)\cdot f_{plus}(x_2-x_3)\cdot f_{plus}(x_2-x_4).$$

As denoted in FIG. 6, $x_1$ is the starting x coordinate of edge i, $x_2$ is the ending x coordinate of edge i, $X_3$ is the starting x coordinate of edge j, and $X_4$ is the ending x coordinate of edge j. Thus, smooth functions are again used to assess whether two edges overlap or not. A buffer distance, $d_{buf}$, is provided to handle intermediate conditions of overlap.

Determining Manufacturing Gap Penalty to Determine Manufacturability

Figure 9:
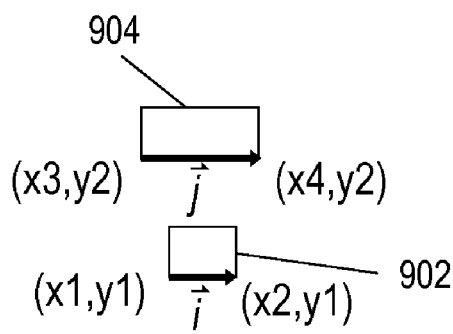
FIG. 9 is a diagram of mask layout data polygons having edges in relation to which a manufacturing gap penalty can be determined, according to an embodiment of the invention.

FIG. 9 shows representative polygons 902 and 904 in relation to which how a manufacturing gap penalty to determine manufacturability is determined, according to an embodiment of the invention. The edge i is located within the polygon 902, whereas the edge j is located within the polygon 904. Thus, the edges i and j are in different polygons, and are at least substantially parallel to one another. The manufacturing gap penalty relates to the penalty incurred in manufacturing the lithographic mask due to the gap between the polygons 902 and 904, and specifically due to the gap between these edges.

To determine the manufacturing gap penalty in part 406 of the method 400 of FIG. 4 for a selected target edge pair having a first edge and a second edge that are at least substantially parallel to one another and are located in different polygons, the following expression is evaluated:

$$P_{gap}=P_{gap\_size}\times P_{overlap}$$

The gap penalty $P_{gap}$ is defined as a product of two assessment functions: a gap size factor function $P_{gap\_size}$ and an overlap detection factor function $P_{overlap}$.

The gap size factor function $P_{gap\_size}$ can be defined as has been described in the preceding section of the detailed description in relation to FIG. 8A. The overlap detection factor function $P_{overlap}$ can be defined as has been described in the preceding section of the detailed description in relation to FIGS. 8E and 8F. Thus, both of these functions, as well as the function $P_{gap}$, are smoothly varying continuous functions, as opposed to non-smoothly varying discontinuous functions. The functions are desirably differentiable, and may be defined as piece-wise quadratic functions or sigmoid functions in varying embodiments of the invention.

Determining Manufacturing Crossing Penalty to Determine Manufacturability

Figure 10A:
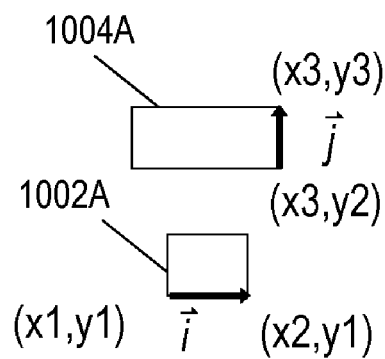
FIGS. 10A, 10B, 10C, and 10D are diagrams of mask layout data polygons having edges in relation to which a manufacturing crossing penalty can be determined, according to an embodiment of the invention.
Figure 10B:
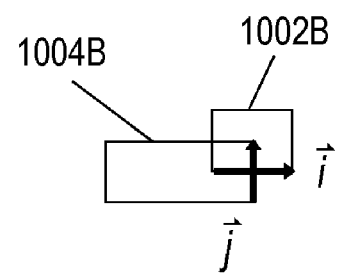
Figure 10C:
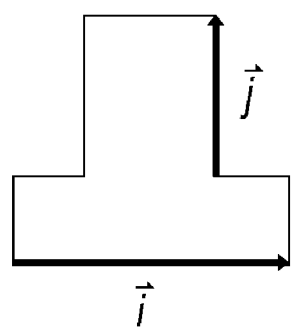
Figure 10D:
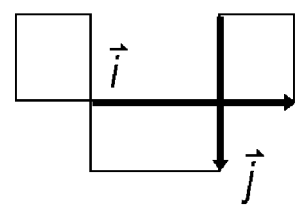

FIGS. 10A, 10B, 10C, and 10D show representative polygons in relation to which how a manufacturing crossing penalty to determine manufacturability is determined, according to an embodiment of the invention. FIGS. 10A and 10B show different polygons case. In FIGS. 10A and 10B, the edge i are located within the polygon 1002A and 1002B, whereas the edge j are located within the polygon 1004A and 1004B. FIGS. 10C and 10D show one polygon case. Thus, the edges i and j are at least substantially perpendicular to one another. The manufacturing crossing penalty relates to the penalty incurred in manufacturing the lithographic mask due to the potential overlap between different polygons and a bow tie shape of one polygon. Thus, FIGS. 10A and 10C are not penalized and FIGS. 10B and 10D are heavily penalized.

To determine the manufacturing crossing penalty in part 406 of the method 400 of FIG. 4 for a selected target edge pair having a first edge and a second edge that are at least substantially perpendicular to one another, the following expression is evaluated:

$$P_{crossing} = w_{crossing} \times P_{crossing\_i\_j} \times P_{crossing\_j\_i}$$

The crossing penalty $P_{crossing}$ is defined as a product of a constant $w_{crossing}$ and two assessment functions $P_{crossing\_i\_j}$ and $P_{crossing\_j\_i}$. The constant $w_{crossing}$ refers to a weight coefficient. The functions $P_{crossing}$, $P_{crossing\_i\_j}$, and $P_{crossing\_j\_i}$ are smoothly varying continuous functions, as opposed to non-smoothly varying discontinuous functions. The functions are desirably differentiable, and may be defined as piece-wise quadratic functions or sigmoid functions in varying embodiments of the invention.

Figure 11A:
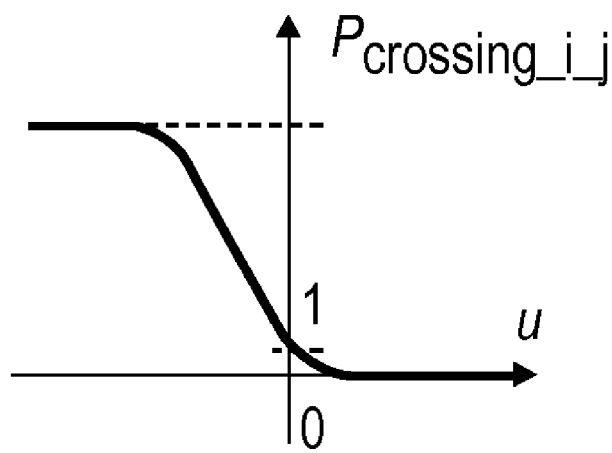
FIGS. 11A and 11B are diagrams of smooth, continuous, and differentiable functions that can be used to determine manufacturing penalties such as a crossing penalty, according to varying embodiments of the invention.
Figure 11B:
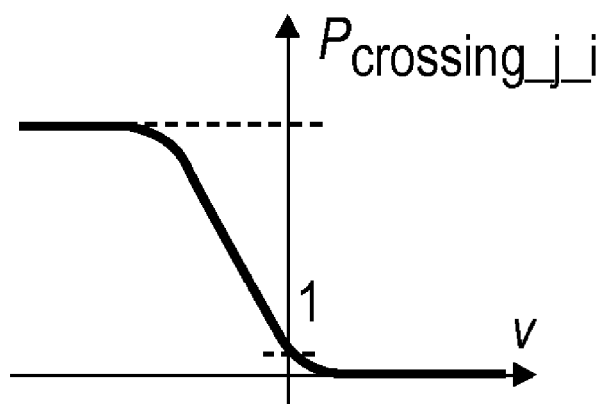

FIGS. 11A and 11B illustratively depict the assessment functions $P_{crossing\_i\_j}$ and $P_{crossing\_j\_i}$, according to an embodiment of the invention. $P_{crossing\_i\_j}$ denotes a manufacturing penalty owing to the edge i crossing the second edge j, whereas $P_{crossing\_i\_j}$ denotes a manufacturing penalty owing to the edge j crossing the edge i. Thus, $P_{crossing\_i\_j}$ focuses on the edge i in relation to the edge j, whereas $P_{crossing\_j\_i}$ focuses on the edge j in relation to the edge i.

It is noted that for the polygons 1002A and 1004A of FIG. 10A, the edge i is a horizontal edge having starting coordinates $(x_1, y_1)$ and ending coordinates $(x_2, y_1)$, and the edge j is a vertical edge having starting coordinates $(X_3, Y_2)$ and ending coordinates $(X_3, y_3)$. As such, the value u used to determine $P_{crossing\_i\_j}$ in FIG. 11A is $u = (x_1 - x_3) \cdot (x_2 - X_3)$. By comparison, the value v used to determined $P_{crossing\_j\_i}$ in FIG. 11B is $v = (y_1 - y_2) \cdot (y_1 - y_3)$.

Optimizing Lithographic Mask

Once the manufacturability of the lithographic mask has been determined in part 408 of the method 400 of FIG. 4, it can be optimized in part 410 as has been summarized above. An example of a relatively straightforward optimization is to modify a polygon that has two edges defining a jog shape to instead define a tab-like job shape. Tab-like jog shapes are easier to manufacture than jog shapes, and as such this optimization reduces the manufacturing penalty in manufacturing the lithographic mask in question.

For example, a polygon may have a first edge and a second edge. Initially, where these edges define a jog shape, the first and the second edges are relatively long, where the edges have opposite directions. After modification, the edges define a tab-like jog shape, which the two edges are relatively short.

Figure 12:
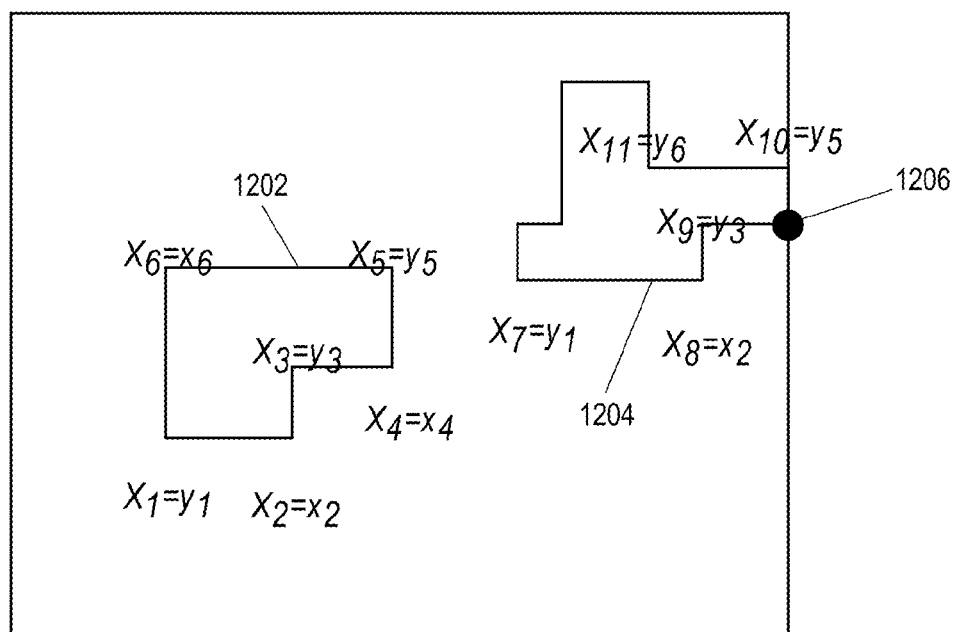
FIG. 12 is a diagram of a representative mask layout data cell in relation to which lithographic mask optimization can be performed, according to an embodiment of the present invention.

More generally, as has been described above, optimization can include setting up variables and constraints for an optimization problem, and then solving the resulting nonlinear optimization problem. In particular, independent variables can be extracted with consideration of the Manhattan requirement as well as of different symmetries along cell boundaries. For instance, FIG. 12 shows a representative cell 1200, according to an embodiment of the invention. The cell 1200 includes polygons 1202 and 1204.

In FIG. 12, $X_i$ are independent variables used in optimization, and $(x_i, y_i)$ are the coordinates of each corner of the polygons 1202 and 1204. For each corner, at most just one of the x or y coordinates is assigned as an independent variable, due to the Manhattan requirement. When an edge is on the boundary of the cell 1200, one coordinate can be skipped because this edge cannot move away from the boundary due to symmetry considerations. For example, the point 1206 can be skipped if even minor symmetry is assumed along this boundary of the cell 1200. Such extraction of independent variables reduces the total computation and improves the convergence of manufacturability optimization.

Figure 13:
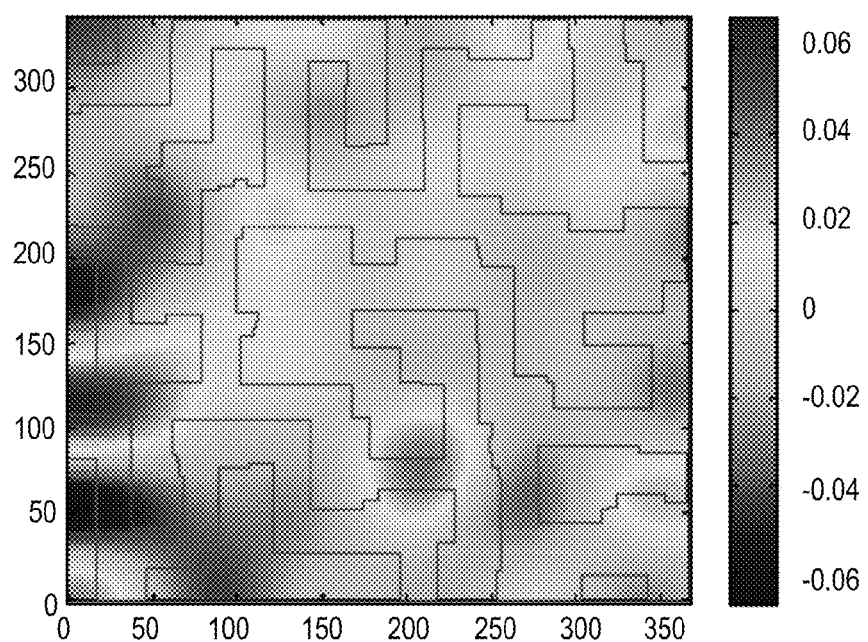
FIG. 13 is a diagram depicting an exemplary spatial domain diffraction orders error function, according to an embodiment of the invention.

Other lithographic metrics can be considered during optimization using the manufacturability determined in part 408 of the method 400. For example, different types of diffraction orders error functions can be implemented, such as a sum of the square of diffraction orders error function, a maximum diffraction orders error function, and a spatial domain diffraction orders error function. FIG. 13 particularly shows an example of a spatial domain diffraction orders error function, according to an embodiment of the invention. In particular, FIG. 13 shows an inverse Fourier transform of a diffraction orders error function. Furthermore, weighted diffraction order error functions can be implemented to provide different tolerances to different diffraction orders, in accordance with their effects on the final image of the photolithographic mask in question. Spatial domain diffraction order errors and worst manufacturable region detection may also be employed to identify problematic areas within the mask layout data that may deserve special attention.

Conclusion

It is noted that, although specific embodiments have been illustrated and described herein, it will be appreciated by those of ordinary skill in the art that any arrangement calculated to achieve the same purpose may be substituted for the specific embodiments shown. This application is intended to cover any adaptations or variations of embodiments of the present invention. For example, a write-back cache may or may not be employed. Therefore, it is manifestly intended that this invention be limited only by the claims and equivalents thereof

We claim:

1. A method for determining manufacturability of a lithographic mask employed in fabricating instances of a semiconductor device, comprising:

selecting a plurality of target edge pairs from mask layout data of the lithographic mask, for determining a manufacturing penalty in making the lithographic mask, the mask layout data comprising a plurality of polygons, each polygon having a plurality of edges, each target edge pair defined by two of the edges of one or more of the polygons;

determining the manufacturability of the lithographic mask by a computer, including determining the manufacturing penalty in making the lithographic mask, where determining the manufacturing penalty is based on the target edge pairs as selected, and where determining the manufacturability of the lithographic mask comprises using continuous derivatives characterizing the manufacturability of the lithographic mask on a continuous scale; and, outputting the manufacturability of the lithographic mask by the computer, where the manufacturability of the lithographic mask is dependent on the manufacturing penalty in making the lithographic mask, wherein determining the manufacturability of the lithographic mask, including determining the manufacturing penalty in making the lithographic mask, comprises:

for a selected target edge pair having a first edge and a second edge that belong to a same polygon and that are at least substantially parallel to one another, determining a manufacturing shape penalty resulting from the selected target edge pair, the manufacturing shape penalty related to a penalty incurred in manufacturing the lithographic mask due to a shape of the same polygon, wherein determining the manufacturing shape penalty comprises evaluating $$P_{shape}=P_{gap\_size} \times P_{jog\_stair} \times P_{aspect\_ratio\_i\_a} \times P_{aspect\_ratio\_j\_a} \times P_{overlap},$$

where $P_{shape}$ denotes the manufacturing shape penalty, $P_{gap\_size}$ denotes a manufacturing penalty owing to a size of a gap between the first and the second edges, $P_{jog\_stair}$ denotes a manufacturing penalty owing to whether the first and the second edges define a jog shape or a stair shape, $P_{aspect\_ratio\_i\_a}$ denotes a manufacturing penalty owing to an aspect ratio of the first edge denoted as i relative to a size of a gap between the two edges i and j, $P_{aspect\_ratio\_j\_a}$ denotes a manufacturing penalty owing to an aspect ratio of the second edge denoted as j relative to the size of a gap between the two edges i and j, and $P_{overlap}$ denotes a manufacturing penalty owing to a degree of overlap between the first and the second edges, and wherein $P_{shape}$, $P_{gap\_size}$, $P_{jog\_stair}$, $P_{aspect\_ratio\_i\_a}$, $P_{aspect\_ratio\_j\_a}$, and $P_{overlap}$ are smoothly varying continuous functions, as opposed to non-smoothly varying discontinuous functions.

2. The method of claim 1, wherein using the continuous derivatives characterizing the manufacturability of the lithographic mask on the continuous scale comprises using smoothly varying assessment functions representing the manufacturing penalty in making the lithographic mask.

3. The method of claim 1, wherein determining the manufacturing shape penalty comprises evaluating a smoothly varying continuous function denoting a manufacturing penalty owing to whether the first and the second edges define a jog shape or a stair shape, where the first edge is defined by two first starting coordinates and two first ending coordinates, and the second edge is defined by two second starting coordinates and two second ending coordinates, where the jog shape occurs where two edges are long compared to a size of a gap between the edges, and a direction of the first edge is opposite to a direction of the second edge, and where the stair shape occurs where a direction of the first edge is equal to a direction of the second edge.

4. The method of claim 1, further comprising optimizing the lithographic mask based on the manufacturability of the lithographic mask determined and based on the manufacturing penalty determined.

5. The method of claim 4, wherein optimizing the lithographic mask comprises, for a selected polygon having a first edge and a second edge that define a jog shape, modifying the selected polygon so that the first edge and the second edge instead define a modified jog shape, where the jog shape occurs where two edges are long compared to a size of a gap between the edges, and a direction of the first edge is opposite to a direction of the second edge, and where the modified jog shape results where two edges are short compared to a size of gap between the edges, and a direction of the first edge is opposite to a direction of the second edge.

6. The method of claim 1, further comprising making the lithographic mask.

7. The method of claim 6, further comprising fabricating the instances of the semiconductor device using the lithographic mask.

8. The method of claim 1, wherein outputting the manufacturability of the lithographic mask comprises displaying the manufacturability of the lithographic mask for viewing by a user.

9. A method for determining manufacturability of a lithographic mask employed in fabricating instances of a semiconductor device, comprising:

selecting a plurality of target edge pairs from mask layout data of the lithographic mask, for determining a manufacturing penalty in making the lithographic mask, the mask layout data comprising a plurality of polygons, each polygon having a plurality of edges, each target edge pair defined by two of the edges of one or more of the polygons;

determining the manufacturability of the lithographic mask by a computer, including determining the manufacturing penalty in making the lithographic mask, where determining the manufacturing penalty is based on the target edge pairs as selected, and where determining the manufacturability of the lithographic mask comprises using continuous derivatives characterizing the manufacturability of the lithographic mask on a continuous scale; and, outputting the manufacturability of the lithographic mask by the computer, where the manufacturability of the lithographic mask is dependent on the manufacturing penalty in making the lithographic mask, wherein determining the manufacturability of the lithographic mask, including determining the manufacturing penalty in making the lithographic mask, comprises:

for a selected target edge pair having a first edge belong to a first polygon and a second edge belonging to a second polygon that is different than the first polygon, the first and the second edges being at least substantially parallel to one another, determining a manufacturing gap penalty resulting from the selected target edge pair, the manufacturing gap penalty related to a penalty incurred in manufacturing the lithographic mask due to a gap between the first and the second polygons, wherein determining the manufacturing gap penalty comprises evaluating $$P_{gap}=P_{gap\_size} \times P_{overlap},$$

where $P_{gap}$ denotes the manufacturing gap penalty, $P_{gap\_size}$ denotes a manufacturing penalty owing to a size of a gap between the first and the second edges, $P_{overlap}$ denotes a manufacturing penalty owing to a degree of overlap between the first and the second edges, and wherein $P_{gap}$, $P_{gap\_size}$, and $P_{overlap}$ are smoothly varying continuous functions, as opposed to non-smoothly varying discontinuous functions.

10. The method of claim 9, wherein using the continuous derivatives characterizing the manufacturability of the lithographic mask on the continuous scale comprises using smoothly varying assessment functions representing the manufacturing penalty in making the lithographic mask.

11. The method of claim 9, further comprising optimizing the lithographic mask based on the manufacturability of the lithographic mask determined and based on the manufacturing penalty determined.

12. The method of claim 11, wherein optimizing the lithographic mask comprises, for a selected polygon having a first edge and a second edge that define a jog shape, modifying the selected polygon so that the first edge and the second edge instead define a modified jog shape, where the jog shape occurs where two edges are long compared to a size of a gap between the edges, and a direction of the first edge is opposite to a direction of the second edge, and where the modified jog shape results where two edges are short compared to a size of gap between the edges, and a direction of the first edge is opposite to a direction of the second edge.

13. A method for determining manufacturability of a lithographic mask employed in fabricating instances of a semiconductor device, comprising:

selecting a plurality of target edge pairs from mask layout data of the lithographic mask, for determining a manufacturing penalty in making the lithographic mask, the mask layout data comprising a plurality of polygons, each polygon having a plurality of edges, each target edge pair defined by two of the edges of one or more of the polygons;

determining the manufacturability of the lithographic mask by a computer, including determining the manufacturing penalty in making the lithographic mask, where determining the manufacturing penalty is based on the target edge pairs as selected, and where determining the manufacturability of the lithographic mask comprises using continuous derivatives characterizing the manufacturability of the lithographic mask on a continuous scale; and, outputting the manufacturability of the lithographic mask by the computer, where the manufacturability of the lithographic mask is dependent on the manufacturing penalty in making the lithographic mask, wherein determining the manufacturability of the lithographic mask, including determining the manufacturing penalty in making the lithographic mask, comprises:

for a selected target edge pair having a first edge belong to a first polygon and a second edge belonging to a second polygon that is different than the first polygon, the first and the second edges being at least substantially perpendicular to one another, determining a manufacturing crossing penalty resulting from the selected target edge pair, the manufacturing gap penalty related to a penalty incurred in manufacturing the lithographic mask due to potential overlap between the first and the second polygons, wherein determining the manufacturing crossing penalty comprises evaluating $$P_{crossing} = w_{crossing} \times P_{crossing\_i\_j} \times P_{crossing\_j\_i},$$

where $P_{crossing}$ denotes the manufacturing crossing penalty, $w_{crossing}$ denotes a weight coefficient, $P_{crossing\_i\_j}$ denotes a manufacturing penalty owing to the first edge denoted as i crossing the second edge denoted as j, and $P_{crossing\_j\_i}$ denotes a manufacturing penalty owing to the second edge denoted as j crossing the first edge denoted as i, and wherein $P_{crossing}$, $P_{crossing\_i\_j}$, and $P_{crossing\_j\_i}$ are smoothly varying continuous functions, as opposed to non-smoothly varying discontinuous functions.

14. The method of claim 13, wherein using the continuous derivatives characterizing the manufacturability of the lithographic mask on the continuous scale comprises using smoothly varying assessment functions representing the manufacturing penalty in making the lithographic mask.

15. The method of claim 13, further comprising optimizing the lithographic mask based on the manufacturability of the lithographic mask determined and based on the manufacturing penalty determined.

16. The method of claim 15, wherein optimizing the lithographic mask comprises, for a selected polygon having a first edge and a second edge that define a jog shape, modifying the selected polygon so that the first edge and the second edge instead define a modified jog shape, where the jog shape occurs where two edges are long compared to a size of a gap between the edges, and a direction of the first edge is opposite to a direction of the second edge, and where the modified jog shape results where two edges are short compared to a size of gap between the edges, and a direction of the first edge is opposite to a direction of the second edge.

17. A non-transitory computer-readable medium having one or more computer programs stored in the medium, such that execution of the one or more computer programs by a computer causes a method to be performed, wherein the method is for determining manufacturability of a lithographic mask employed in fabricating instances of a semiconductor device, the method comprising:

selecting a plurality of target edge pairs from mask layout data of the lithographic mask, for determining a manufacturing penalty in making the lithographic mask, the mask layout data comprising a plurality of polygons, each polygon having a plurality of edges, each target edge pair defined by two of the edges of one or more of the polygons;

determining the manufacturability of the lithographic mask, including determining the manufacturing penalty in making the lithographic mask, where determining the manufacturing penalty is based on the target edge pairs as selected, and where determining the manufacturability of the lithographic mask comprises using continuous derivatives characterizing the manufacturability of the lithographic mask on a continuous scale by using smoothly varying assessment functions representing the manufacturing penalty in making the lithographic mask, wherein determining the manufacturability of the lithographic mask is achieved by performing one or more of:

(a) for a first selected target edge pair having a first edge and a second edge that belong to a same polygon and that are at least substantially parallel to one another, determining a manufacturing shape penalty resulting from the first selected target edge pair, the manufacturing shape penalty related to a penalty incurred in manufacturing the lithographic mask due to a shape of the same polygon;

(b) for a second selected target edge pair having a third edge belong to a third polygon and a fourth edge belonging to a fourth polygon that is different than the third polygon, the third and the fourth edges being at least substantially parallel to one another, determining a manufacturing gap penalty resulting from the second selected target edge pair, the manufacturing gap penalty related to a penalty incurred in manufacturing the lithographic mask due to a gap between the third and the fourth polygons; and, (c) for a third selected target edge pair having a fifth edge belong to a fifth polygon and a sixth edge belonging to a sixth polygon that is different than the fifth polygon, the fifth and the sixth edges being at least substantially perpendicular to one another, determining a manufacturing crossing penalty resulting from the third selected target edge pair, the manufacturing gap penalty related to a penalty incurred in manufacturing the lithographic mask due to potential overlap between the fifth and the sixth polygons, and wherein determining the manufacturing shape penalty comprises evaluating one or more of:

$P_{shape} = P_{gap\_size} \times P_{jog\_stair} \times P_{aspect\_ratio\_i\_a} \times P_{aspect\_ratio\_j\_a} \times P_{overlap}$, where $P_{shape}$ denotes the manufacturing shape penalty, $P_{gap\_size}$ denotes a manufacturing penalty owing to a size of a gap between the first and the second edges, $P_{jog\_stair}$ denotes a manufacturing penalty owing to whether the first and the second edges define a jog shape or a stair shape, $P_{aspect\_ratio\_i\_a}$ denotes a manufacturing penalty owing to an aspect ratio of the first edge denoted as i relative to a size of a gap between the two edges i and j, $P_{aspect\_ratio\_j\_a}$ denotes a manufacturing penalty owing to an aspect ratio of the second edge denoted as j relative to the size of a gap between the two edges i and j, and $P_{overlap}$ denotes a manufacturing penalty owing to a degree of overlap between the first and the second edges, and where $P_{shape}$, $P_{gap\_size}$, $P_{jog\_stair}$, $P_{aspect\_ratio\_i\_a}$, $P_{aspect\_ratio\_j\_a}$, and $P_{overlap}$ are smoothly varying continuous functions, as opposed to non-smoothly varying discontinuous functions;

$P_{gap} = P_{gap\_size} \times P_{overlap}$, where $P_{gap\_size}$ denotes the manufacturing gap penalty, $P_{gap\_size}$ denotes a manufacturing penalty owing to a size of a gap between the third and the fourth edges, $P_{overlap}$ denotes a manufacturing penalty owing to a degree of overlap between the third and the fourth edges, and where $P_{gap}$, $P_{gap\_size}$, and $P_{overlap}$ are smoothly varying continuous functions, as opposed to non-smoothly varying discontinuous functions;

$P_{crossing} = w_{crossing} \times P_{crossing\_i\_j} \times P_{crossing\_j\_i}$, where $P_{crossing}$ denotes the manufacturing crossing penalty, $w_{crossing}$ denotes a weight coefficient, $P_{crossing\_i\_j}$ denotes a manufacturing penalty owing to the fifth edge denoted as i crossing the sixth edge denoted as j, and $P_{crossing\_j\_i}$ denotes a manufacturing penalty owing to the sixth edge denoted as j crossing the fifth edge denoted as i, and where $P_{crossing}$, $P_{crossing\_i\_j}$, and $P_{crossing\_j\_i}$ are smoothly varying continuous functions, as opposed to non-smoothly varying discontinuous functions.

18. A non-transitory computer-readable medium having one or more computer programs stored in the medium, such that execution of the one or more computer programs by a computer causes a method to be performed, wherein the method is for determining manufacturability of a lithographic mask employed in fabricating instances of a semiconductor device, the method comprising:

selecting a plurality of target edge pairs from mask layout data of the lithographic mask, for determining a manufacturing penalty in making the lithographic mask, the mask layout data comprising a plurality of polygons, each polygon having a plurality of edges, each target edge pair defined by two of the edges of one or more of the polygons;

determining the manufacturability of the lithographic mask, including determining the manufacturing penalty in making the lithographic mask, where determining the manufacturing penalty is based on the target edge pairs as selected, and where determining the manufacturability of the lithographic mask comprises using continuous derivatives characterizing the manufacturability of the lithographic mask on a continuous scale by using smoothly varying assessment functions representing the manufacturing penalty in making the lithographic mask, wherein determining the manufacturability of the lithographic mask is achieved by performing all of:

(a) for a first selected target edge pair having a first edge and a second edge that belong to a same polygon and that are at least substantially parallel to one another,
determining a manufacturing shape penalty resulting from the first selected target edge pair, the manufacturing shape penalty related to a penalty incurred in manufacturing the lithographic mask due to a shape of the same polygon;

(b) for a second selected target edge pair having a third edge belong to a third polygon and a fourth edge belonging to a fourth polygon that is different than the third polygon, the third and the fourth edges being at least substantially parallel to one another,
determining a manufacturing gap penalty resulting from the second selected target edge pair, the manufacturing gap penalty related to a penalty incurred in manufacturing the lithographic mask due to a gap between the third and the fourth polygons; and, (c) for a third selected target edge pair having a fifth edge belong to a fifth polygon and a sixth edge belonging to a sixth polygon that is different than the fifth polygon, the fifth and the sixth edges being at least substantially perpendicular to one another,
determining a manufacturing crossing penalty resulting from the third selected target edge pair, the manufacturing gap penalty related to a penalty incurred in manufacturing the lithographic mask due to potential overlap between the fifth and the sixth polygons, (a) wherein determining the manufacturing shape penalty comprises evaluating $P_{shape} = P_{gap\_size} \times P_{jog\_stair} \times P_{aspect\_ratio\_i\_a} \times P_{aspect\_ratio\_j\_a} \times P_{overlap}$, where $P_{shape}$ denotes the manufacturing shape penalty, $P_{gap\_size}$ denotes a manufacturing penalty owing to a size of a gap between the first and the second edges, $P_{jog\_stair}$ denotes a manufacturing penalty owing to whether the first and the second edges define a jog shape or a stair shape, $P_{aspect\_ratio\_i\_a}$ denotes a manufacturing penalty owing to an aspect ratio of the first edge denoted as i relative to a size of a gap between the two edges i and j, $P_{aspect\_ratio\_j\_a}$ denotes a manufacturing penalty owing to an aspect ratio of the second edge denoted as j relative to the size of a gap between the two edges i and j, and $P_{overlap}$ denotes a manufacturing penalty owing to a degree of overlap between the first and the second edges, and where $P_{shape}$, $P_{gap\_size}$, $P_{jog\_stair}$, $P_{aspect\_ratio\_i\_a}$, $P_{aspect\_ratio\_j\_a}$, and $P_{overlap}$ are smoothly varying continuous functions, as opposed to non-smoothly varying discontinuous functions, (b) wherein determining the manufacturing gap penalty comprises evaluating $P_{gap} = P_{gap\_size} \times P_{overlap}$, where $P_{gap}$ denotes the manufacturing gap penalty, $P_{gap\_size}$ denotes a manufacturing penalty owing to a size of a gap between the third and the fourth edges, $P_{overlap}$ denotes a manufacturing penalty owing to a degree of overlap between the third and the fourth edges, and where $P_{gap}$, $P_{gap\_size}$, and $P_{overlap}$ are smoothly varying continuous functions, as opposed to non-smoothly varying discontinuous functions, (c) and wherein determining the manufacturing crossing penalty comprises evaluating $$P_{crossing} = w_{crossing} \times P_{crossing\_i\_j} \times P_{crossing\_j\_i},$$

where $P_{crossing}$ denotes the manufacturing crossing penalty, $w_{crossing}$ denotes a constant, $P_{crossing\_i\_j}$ denotes a manufacturing penalty owing to the fifth edge denoted as i crossing the sixth edge denoted as j, and $P_{crossing\_j\_i}$ denotes a manufacturing penalty owing to the sixth edge denoted as j crossing the fifth edge denoted as i, and where $P_{crossing}$, $P_{crossing\_i\_j}$, and $P_{crossing\_j\_i}$ are smoothly varying continuous functions, as opposed to non-smoothly varying discontinuous functions.

* * * * *